United States Patent
Peterson et al.

(10) Patent No.: US 11,803,024 B2
(45) Date of Patent: Oct. 31, 2023

(54) PHOTONIC POWER CONVERTER LIGHT TRANSPORT

(71) Applicant: META PLATFORMS TECHNOLOGIES, LLC, Menlo Park, CA (US)

(72) Inventors: Jonathan Robert Peterson, Woodinville, WA (US); John Goward, Redmond, WA (US); Maik Andre Scheller, Redmond, WA (US); Andrew John Ouderkirk, Kirkland, WA (US); Christopher Yuan Ting Liao, Seattle, WA (US); Giuseppe Calafiore, Woodinville, WA (US); Alexander Koshelev, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 86 days.

(21) Appl. No.: 17/374,932

(22) Filed: Jul. 13, 2021

(65) Prior Publication Data
US 2022/0350100 A1 Nov. 3, 2022

Related U.S. Application Data

(60) Provisional application No. 63/181,378, filed on Apr. 29, 2021.

(51) Int. Cl.
*G02B 6/42* (2006.01)
*G02B 26/08* (2006.01)
*G02B 5/30* (2006.01)
*G06F 3/01* (2006.01)

(52) U.S. Cl.
CPC ......... *G02B 6/4298* (2013.01); *G02B 5/3025* (2013.01); *G02B 26/0833* (2013.01); *G06F 3/014* (2013.01); *G06F 3/016* (2013.01)

(58) Field of Classification Search
CPC .............. G02B 5/3025; G02B 6/4298; G02B 26/0833; G06F 3/014; G06F 3/016
See application file for complete search history.

(56) References Cited

U.S. PATENT DOCUMENTS

| 5,097,252 A | 3/1992 | Harvill et al. |
| 2011/0302694 A1 | 12/2011 | Wang et al. |
| 2022/0103063 A1 * | 3/2022 | Landig .................. H01L 31/167 |

FOREIGN PATENT DOCUMENTS

| CN | 108459709 A | 8/2018 | |
| CN | 112230769 A | 1/2021 | |
| WO | WO-2019066869 A1 * | 4/2019 | ............. G02B 6/122 |
| WO | 2020064084 A1 | 4/2020 | |

OTHER PUBLICATIONS

International Search Report and Written Opinion for International Application No. PCT/US2022/026583 dated Aug. 12, 2022, 11 pages.

* cited by examiner

*Primary Examiner* — Kevin K Pyo
(74) *Attorney, Agent, or Firm* — Greenberg Traurig, LLP

(57) ABSTRACT

A device includes a light source to emit light and a light detector to receive the light emitted by the light source. The device may include a high voltage optical transformer and may be configured such that the light detector is laterally spaced away from the light source. In some architectures, the light source and the light detector may be arranged in a common plane. A photonic integrated circuit may be used to couple light emitted from the light source to the light detector.

19 Claims, 13 Drawing Sheets

PHOTONIC POWER CONVERTER LIGHT TRANSPORT

CROSS-REFERENCE TO RELATED APPLICATION

This application claims the benefit of priority under 35 U.S.C. § 119(e) of U.S. Provisional Application No. 63/181,378, filed Apr. 29, 2021, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
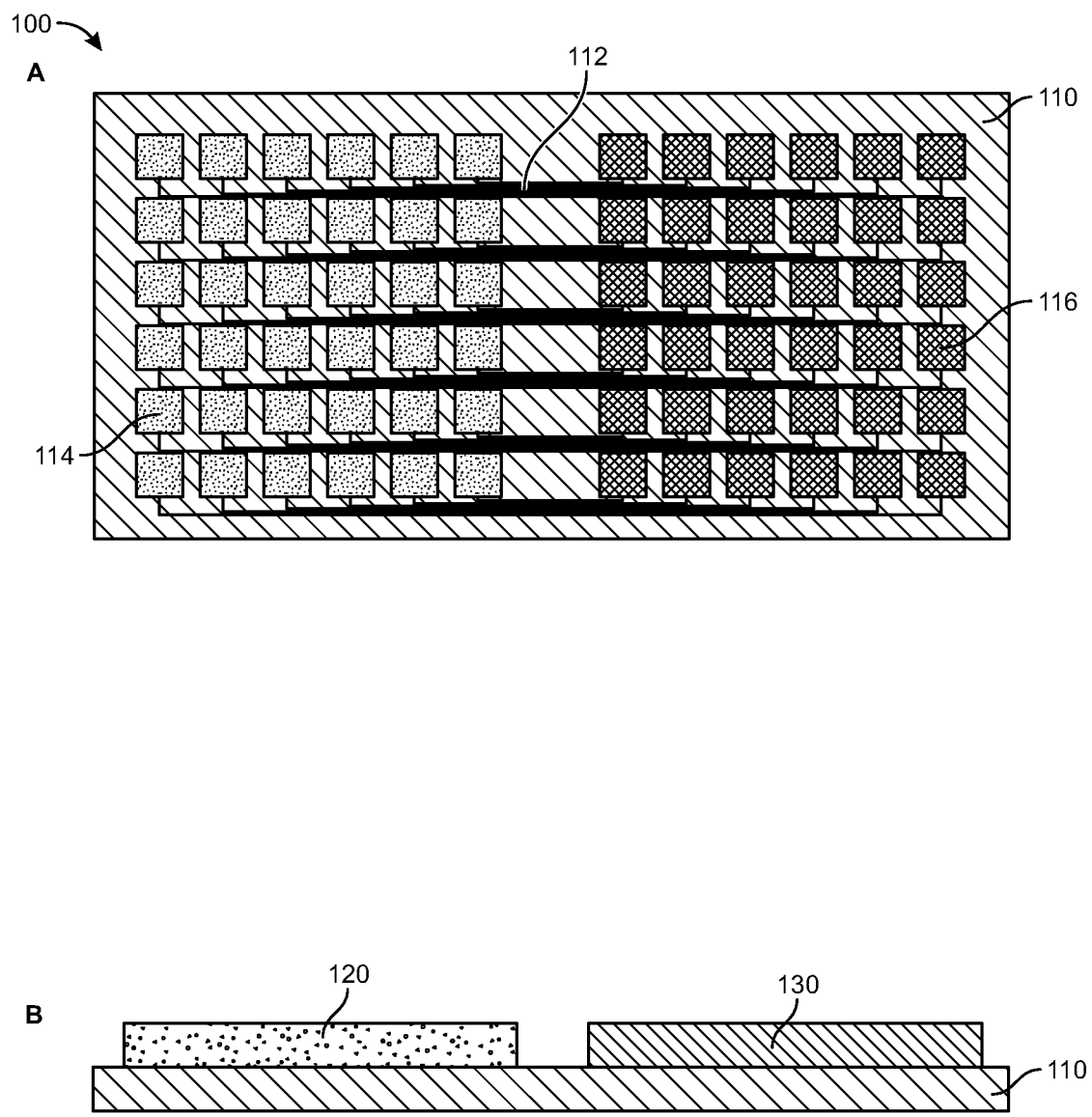
FIG. 1 illustrates a photonic integrated circuit (PIC)-based photonic power converter having a co-planar light source-light detector architecture according to various embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to transformers, i.e., power converters, and more particularly to voltage transformers having optical components. A transformer is an electrical device that may be used for power transfer and voltage conversion (e.g., providing a high voltage output from a low voltage input). High voltages may be used to power a variety of different devices and systems, including high voltage relays, cathode ray tubes, e.g., to generate x-rays and particle beams, piezoelectric actuators, e.g., to manipulate the focal length of variable focal length lenses, and haptic devices. In this regard, a voltage transformer may be used to provide and/or increase voltage output where the generated voltage of a device or system is otherwise insufficient.

Many voltage transformers, including step-up converters (booster converters), step-down converters, and piezo-transformers, for example, may be configured to convert relatively low DC input voltages (~1V-2V) to output voltages greater than 1 kV. As disclosed herein, a "high voltage" optical transformer may in some examples be configured to generate a voltage output of at least approximately 100 V. Example optical transformers may be configured to provide scalable output, i.e., open-circuit voltages from approximately 100 V to greater than approximately 1 kV, e.g., 100, 200, 500, or 1000 V or more, including ranges between any of the foregoing values.

As used herein, the term "approximately" in reference to a particular numeric value or range of values may, in certain embodiments, mean and include the stated value as well as all values within 10% of the stated value. Thus, by way of example, reference to the numeric value "50" as "approximately 50" may, in certain embodiments, include values equal to 50±5, i.e., values within the range 45 to 55.

The design of many such voltage transformers, including the requisite inductors and capacitors, may unduly increase the weight and/or size of the device (e.g., to 1 cm3 and greater), which may be excessive for many applications, including wearable devices. Moreover, such compact devices may generate excess heat that may adversely affect function as well as the comfort of a user. Thus, notwithstanding recent developments, it would be advantageous to provide an economical and efficient high voltage source having a compact footprint and a low thermal budget.

The present disclosure is generally related to high voltage optical transformers, and more specifically to the integration of optically and thermally-efficient high voltage sources. The disclosed system architectures may include a laterally adjacent positioning of a light source and a corresponding light detector, which may moderate the thermal output of the device.

Whereas comparative devices may be characterized by one or more light sources and one or more light detectors disposed in an overlying (i.e., mutually facing) geometry, example photonic power converters may include a light source and a light detector where the light source and the light detector are laterally spaced away from one another. Thus, such a device may include a light source to emit light and a light detector to receive the light emitted by the light source. A photonic integrated circuit may be disposed between the light source and the light detector and may be configured to couple the emitted light to the light detector.

In particular architectures, the light source and the light detector may be arranged on a common plane.

By way of example, the light source may include a surface-emitting device, e.g., a top- or bottom-emitting device such as a vertical cavity surface emitting laser (VCSEL), a vertical external cavity surface emitting laser (VECSEL), or a light-emitting diode (LED) such as an organic light emitting diode (OLED) or a resonant cavity light emitting diode (RCLED). In some embodiments, the light source may include an edge-emitting device, e.g., a laser diode or a superluminescent diode (SLED). In certain embodiments, the light source may include a single emitter or a plurality of emitters in an addressable array.

A light source including a laser diode or a light emitting diode may include an indirect bandgap semiconductor or a direct bandgap semiconductor, such as Si, GaAs, InGaAs, AlGaAs, GaN, InGaN, AlGaN, GaP, GaAsP, AlGaInP, and the like. In some embodiments, the light source may include one or more optical elements configured to enhance light extraction and focusing efficiency, such as one or more micro lenses, total internal reflection (TIR) concentrators and/or total internal reflection-refraction (TIR-R) concentrators. Additionally or alternative, an optical transformer may include a polarizing filter and/or a ring resonator for manipulating the emitted light.

According to certain embodiments, the optical power generation of the light source and hence the output voltage of the optical transformer may be controlled by voltage or current modulation. Such modulation may be analog (e.g., current amplitude modulation) or digital (e.g., pulse width modulation). A PID control circuit may be used to control the modulation and stabilize the output voltage.

The light source may be configured to illuminate one or more photovoltaic cells, e.g., within a photovoltaic cell array. Example photovoltaic cells may include one or more p-n junctions (or p-i-n junctions) within a semiconductor to obtain a current from photons absorbed near the junction(s). Photovoltaic materials within the photovoltaic cells may include bulk layers, quantum wells, quantum wires, or quantum dots, although further structures are contemplated. As a direct bandgap material, gallium arsenide (GaAs) is highly absorbing to photons having an energy greater than its bandgap (Eg). Further example direct bandgap semiconductors include III-V and II-VI compound semiconductors and may include InP, InGaAs, AlGaAs, InGaN, InGaP, InGaAsP, InGaAsPN, AlGaN, GaN, GaP, GaAsP, AlGaInP, and the like. In alternate embodiments, the photovoltaic cells may be manufactured from an indirect bandgap semiconductor such as silicon (Si) or germanium (Ge). For instance, an example monolithic integrated micro photovoltaic cell array may include silicon, where the p-n junctions (or p-i-n junctions) may be formed by lateral doping profiles. Individual photovoltaic cells may be arrayed in parallel or in series and may be suitably dimensioned, e.g., having areal dimensions ranging from approximately 1 mm2 to approximately 1 mm2. Example light sources may include single-mode and multi-mode sources.

In some embodiments, a photonic integrated circuit (PIC) may be disposed between the light source and the photovoltaic cell array to guide emitted light from the light source to the light detector. A photonic integrated circuit is the optical analog of an electrical integrated circuit. Rather than routing electrical signals over wires, a photonic integrated circuit routes optical signals via waveguide channels. Thus, in various embodiments, a photonic integrated circuit may be used as a light transport layer for a photonic power converter.

The implementation of a photonic integrated circuit may enable a number of photonic power converter designs and architectures, and may be used to advantageously configure the number and placement of the light sources and the light detectors, for example. According to some embodiments, a photonic power converter may include a 1:1 or non-1:1 configuration of light sources and light detectors. According to some embodiments, a photonic integrated circuit may allow for a coplanar configuration where the light source and the light detector are located side-by-side, which may provide improved thermal management relative to comparative architectures such as where the light source is stacked over the light detector.

A further advantage to steering light with a photonic integrated circuit may include the ability to source light from fiber-coupled lasers and/or combine multiple light sources with a single light detector. These and other approaches may improve integration into systems where multiple photonic power converter are used.

A photonic integrated circuit may include any material suitable for guiding light, including glass, polymer, and/or semiconductor compositions. The photonic integrated circuit may include crystalline or amorphous materials, for example. In some embodiments, the material for guiding light may be electrically insulating. To inhibit reflective losses, in certain embodiments, the material for guiding light may be characterized by a refractive index of at least approximately 1.5, and may include a solid, a liquid, or a gas. A photonic integrated circuit may additionally include any suitable structure for coupling light into and out of the PIC.

In some embodiments, the light source may include N emitters and the photovoltaic cell array may include N corresponding photovoltaic cells. In further embodiments, the number of emitters may exceed the number of photovoltaic cells. In still further embodiments, the number of photovoltaic cells may exceed the number of emitters. The photonic integrated circuit may further include a micro lens array or other element(s) configured to focus emitted light onto individual photovoltaic cells, e.g., onto the center of respective photovoltaic cells.

A low voltage circuit that controls the light source(s) may be fully decoupled from the high voltage output circuit. Thus, the low voltage circuit may provide a ground loop that is isolated from the high voltage output. With a low voltage input electrically isolated from the high voltage output, the input and output terminals of exemplary HVOTs need not share a common ground, which may significantly decrease the likelihood of electric shock during use. In addition, the output may be characterized by a high impedance. Accordingly, the current between the two output terminals is typically low and insufficient to harm a user.

In a similar vein, the HVOTs disclosed herein may be characterized by a relatively low device capacitance, which limits the total charge stored by the transformers. Rather, in accordance with various embodiments, power may be produced on demand through illumination of the PV cells. In some embodiments, the maximum available electric power of an HVOT may be advantageously limited due to self-heating of the device. That is, in the event of a control circuit failure, rapid thermal overloading may restrict the maximum output power.

As will be appreciated, high voltage optical transformers may generate smaller magnetic fields than comparative inductive high voltage sources and thus may require substantially less shielding, which may beneficially impact the total weight and thickness.

The physical separation of the light source(s) from the light detector(s) may decrease the total amount of generated heat and more evenly distribute heat throughout the system, thus lessening the need for large heat dissipation channels. In certain embodiments, locally generated heat may be transported away from its source using, for example, microfluidic cooling, metallic fibers, liquid metals, heat pipes, and the like. In some embodiments, heat may be directed to nearby devices whose performance may benefit from a higher operational temperature. For example, in a liquid lens, higher temperatures may decrease the viscosity of the enclosed lens fluid, which may increase the response time of the lens.

High voltage optical transformers may be integrated into a wide-range of systems and devices, such as where a compact and light-weight form factor are desired. Example applications include user-wearable systems such as liquid lenses and haptic devices, sensors, medical devices such as implantable devices, and communications systems such as drones and satellites.

A liquid lens, for instance, may be driven by bimorph or electrostatic actuators where the HVOT may be incorporated into the lens architecture in close proximity to the actuators, i.e., as part of the wearable system. In further examples, haptic devices may include vibrotactile haptic actuators, such as a dielectric elastomer actuator or an electrostatic clutch.

High voltage optical transformers may also be used to provide power to sensing systems. By way of example, photomultipliers are capable of detecting single photons and have a large range of applications, including chemical and biological sensing, quantum computing, and the monitoring of neuronal activity. Photomultiplier modules themselves may exhibit a commercially-relevant form factor; however, with typical operational voltages in excess of approximately 1 kV, the limited availability of compact, high voltage power supplies has limited their use in many applications.

A number of medical applications may benefit from a compact, high voltage source. Implantable defibrillators, for instance, are currently relatively large devices that use traditional methods and structures to generate high voltages. Such approaches often require the use of heavy components, such as inductors and transformers. HVOTs, on the other hand, may present both a size benefit and a weight benefit to such an application. In some embodiments, a high voltage optical transformer may be mounted in close proximity to a defibrillator, potentially inside the body. High voltage optical transformers may also be used in miniaturized satellites, such as nano, femto, or pico satellites, where size and weight are often significant parameters.

In certain embodiments, a high voltage optical transformer may be flexible and may be mounted directly on an exemplary device. A "flexible" component, structure, or element (e.g., a flexible high voltage optical transformer) may, in certain embodiments, exhibit a large strain-to-failure, and may accommodate strains of at least approximately 5%, e.g., at least approximately 10%, at least approximately 15%, at least approximately 20%, at least approximately 50%, or at least approximately 100%, including ranges between any of the foregoing values.

A flexible HVOT architecture may be incorporated into wearable systems. The HVOT may be thermally isolated from high voltage driven devices (HVDDs) using, for example, an isolation layer disposed therebetween. A flexible HVOT may include a flexible light source and a thin film array of photovoltaic cells optically coupled to the light source. The flexible light source may include an LED, a micro-LED, an OLED, or a VCSEL, for example. In some embodiments, the flexible light source may include an edge-emitting, or a surface-emitting device coupled to a flexible light guide.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-13, detailed descriptions of optical transformers, i.e., optically-driven voltage converters, as well as devices and systems using such optical transformers. The discussion associated with FIGS. 1-8 relates to photovoltaic (PV) system architectures having spatially decoupled light sources and light detectors. The discussion associated with FIGS. 9-13 relates to exemplary haptic, virtual reality, and augmented reality devices that may include a high voltage optical transformer as disclosed herein.

Referring to FIG. 1, shown is a schematic illustration of an example PIC-based photonic power converter (PPC). A top-down plan view of the PIC-based photonic power converter 100 is shown in FIG. 1A, and a corresponding side view is shown in FIG. 1B. In the illustrated embodiment, PIC-based photonic power converter 100 includes a photonic integrated circuit 110 with an array of illumination sources 120 (such as lasers or LEDs) and a corresponding array of photovoltaic cells 130 each disposed over the photonic integrated circuit 110. The illumination source array 120 is laterally offset from the photovoltaic cell array 130. As will be appreciated, this side-by-side architecture may enable improved thermal management of the PIC-based photonic power converter 100 by distributing the light source(s) and the light detector(s) over a larger area relative to comparative stacked architectures.

Photonic integrated circuit 110 may include optical channels 112 (e.g., optical fibers or waveguides such as planar waveguides) that are configured to route light that is emitted by the illumination sources within array 120 to the photovoltaic cells within array 130. Input gratings 114 and output gratings 116 may be respectively configured to direct light into and out of the optical channels 112. The number of illumination sources within array 120 may be equal to the number of photovoltaic cells within array 130, although alternative architectures are contemplated. As illustrated, the illumination source array 120 and the photovoltaic cell array 130 may be co-planar.

Figure 2:
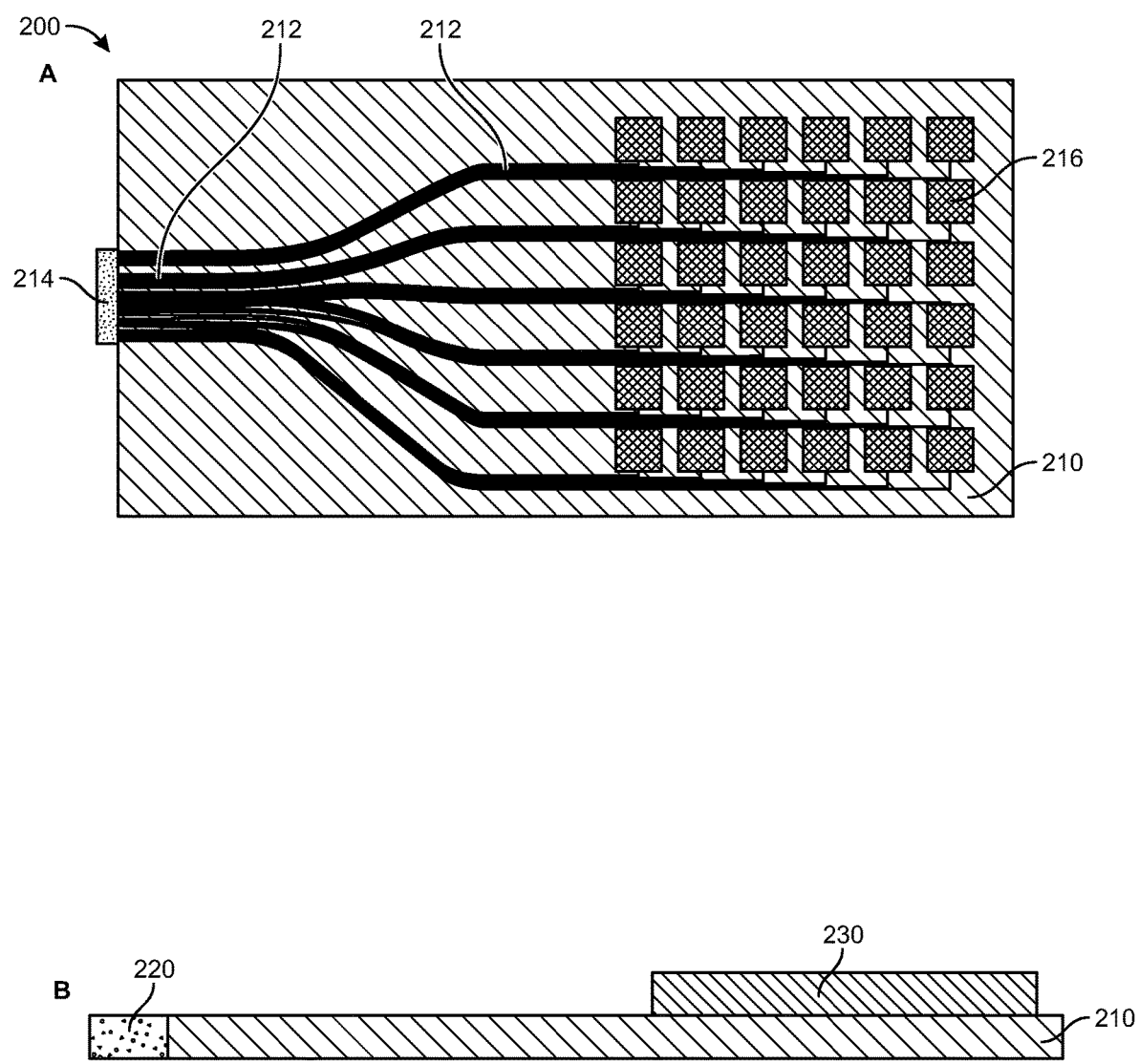
FIG. 2 illustrates a single source photonic integrated circuit (PIC)-based photonic power converter according to some embodiments.

Referring to FIG. 2, shown is a further example PIC-based photonic power converter where the light detectors are laterally offset from a light source. A top-down plan view of the PIC-based photonic power converter 200 is shown in FIG. 2A, and a corresponding side view is shown in FIG. 2B.

PIC-based photonic power converter 200 includes a photonic integrated circuit 210 and a photovoltaic cell array 230 disposed over the photonic integrated circuit 210. A single light source 220 is laterally offset from the photovoltaic cell array 230. The light source 220 and the photovoltaic cell array 230 may be located on separate, parallel planes. Light from light source 220 may be coupled into and out of optical channels 212 via input gratings 214 and output gratings 216, respectively, and routed to selected PV cells (not separately shown) within photovoltaic cell array 230. In the embodiment of FIG. 2, the plurality of PV cells within photovoltaic cell array 230 may be driven by the single light source 220.

Figure 3:
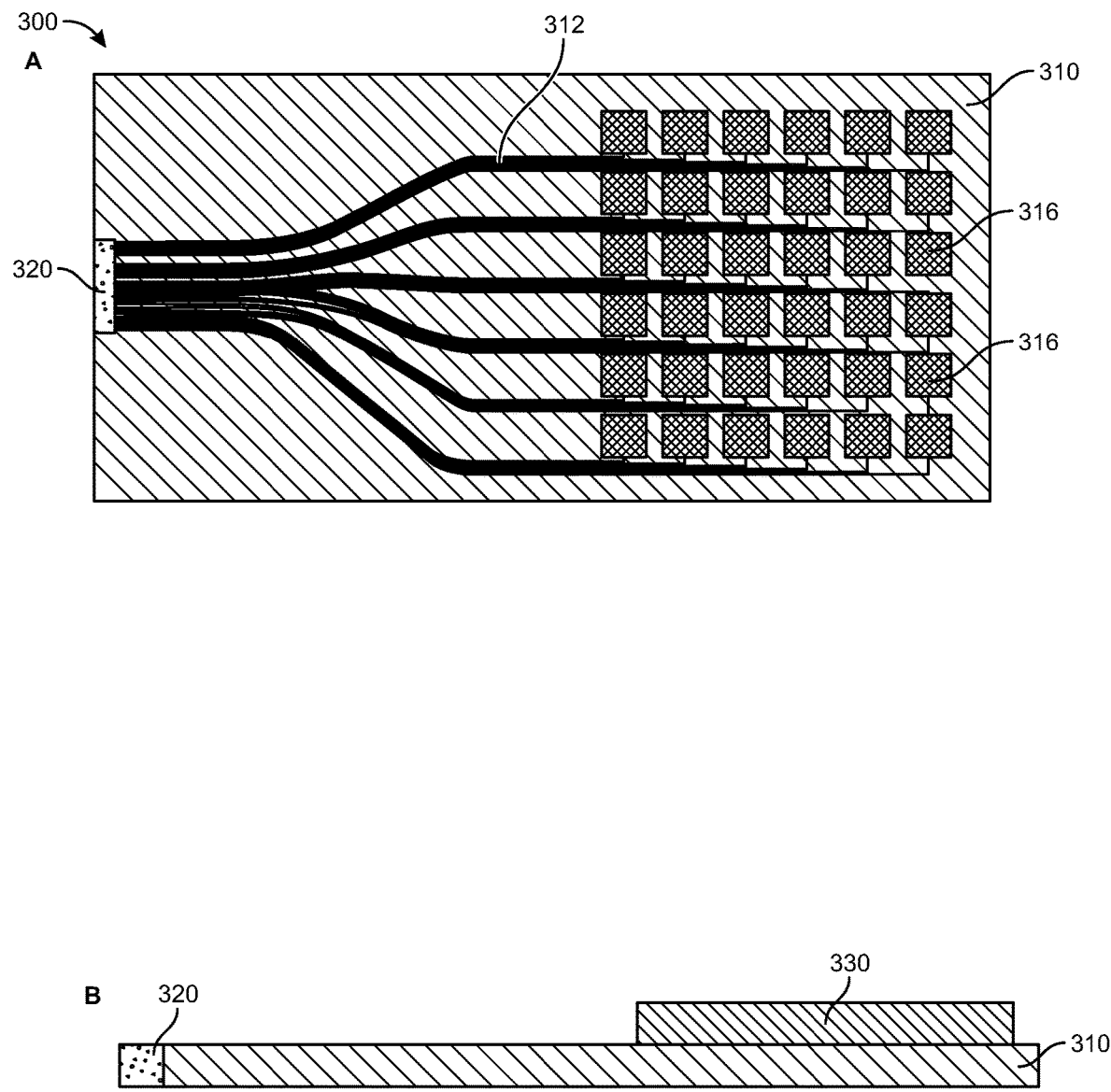
FIG. 3 illustrates a heterogeneous source photonic integrated circuit (PIC)-based photonic power converter according to some embodiments.

In some embodiments, the in-coupling efficiency of emitted light into an optical channel may be improved by integrating the light source into the photonic integrated circuit. Referring to FIG. 3, a top-down plan view and a side view of a PIC-based photonic power converter 300 are shown respectively in FIG. 3A and FIG. 3B. PIC-based photonic power converter 300 includes a photonic integrated circuit 310 and an array 330 of photovoltaic cells (not separately shown) disposed over the photonic integrated circuit 310. A single light source 320 may be laterally offset from the photovoltaic cell array 330 and heterogeneously integrated into the photonic integrated circuit 310 obviating the need for input gratings. Thus, light emitted from the light source 320 may be directly coupled via optical channels 312 to output gratings 316 and into respective photovoltaic cells of the photovoltaic cell array 330.

Figure 4:
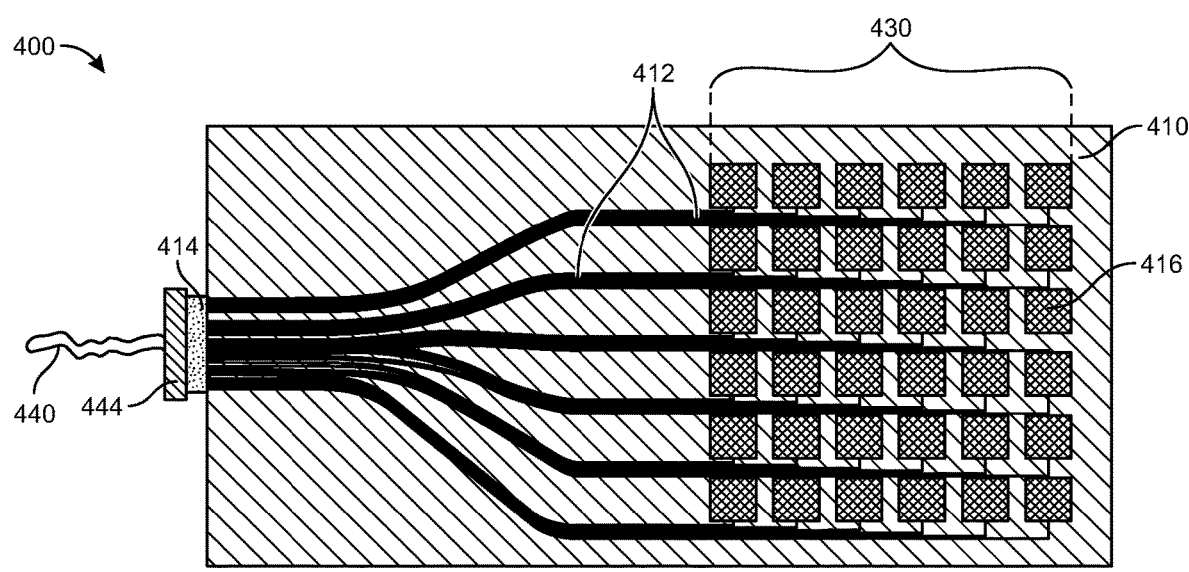
FIG. 4 illustrates a photonic integrated circuit (PIC)-based photonic power converter having a fiber-coupled light source according to certain embodiments.

A further PIC-based photonic power converter architecture is shown schematically in FIG. 4. As illustrated, PIC-based photonic power converter 400 may include a photonic integrated circuit 410 and an array 430 of photovoltaic cells (not separately shown) disposed over the photonic integrated circuit 410. A remotely located light source (not shown) may be optically coupled to the photonic integrated circuit 410 using an optical fiber 440 such that light emitted from the light source may be routed to each photovoltaic cell within array 430. The light source may include one or more emitters, which may be configured in an array. The shape of the light source array, if provided, may be dissimilar, similar, or congruent to the shape of the photovoltaic cell array 430. A fiber coupling element 444 may be used to connect optical fiber 440 with an input grating 414 such that, during use, light emitted by the light source may be routed via optical channels 412 to output gratings 416 and into respective photovoltaic cells of photovoltaic cell array 430.

Figure 5:
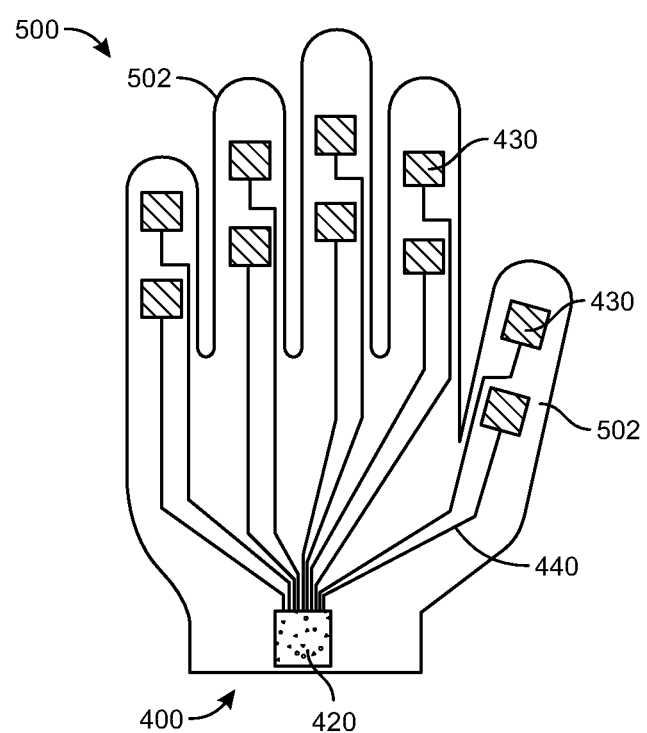
FIG. 5 illustrates a photonic integrated circuit (PIC)-based photonic power converter having a distributed optical fiber network according to some embodiments.

An example implementation of PIC-based photonic power converter 400 is shown in FIG. 5. In the device 500 of FIG. 5, a remote light source 420 may be optically coupled via optical fibers 440 to photovoltaic cell arrays 430. Device 500 may include a haptic glove, for example. Such a distributed architecture may include a single remote light source 420 and plural light detector arrays 430, which may be distributed along fingers 502 of the glove.

By moving the light source 420 away from the individual photovoltaic cell arrays 430, the overall size and weight at these locations can be decreased. In the example of a haptic glove, a single, larger light source may be placed at the wrist where it is less noticeable. Furthermore, a remote light source may be cooled without providing localized cooling solutions where each haptic actuator is placed.

The photovoltaic cell arrays 430 may be directly connected with portions of the device 500 requiring high voltage, thus limiting the distance traveled by the high voltage output and improving user safety. For example, the photovoltaic cell arrays 430 may be connected with haptic actuators disposed along fingers 502.

According to some embodiments, a semiconductor layer may be co-integrated with a PIC-based photonic power converter. A semiconductor (e.g., silicon) layer may include control elements such as transistors and may be used, for example, to drive the light source(s), regulate brightness, monitor temperature, and regulate output voltage. Additionally or alternatively, a semiconductor layer may be used to programmatically change the output of the photonic power converter or dynamically adjust its output given real-time feedback.

Figure 6:
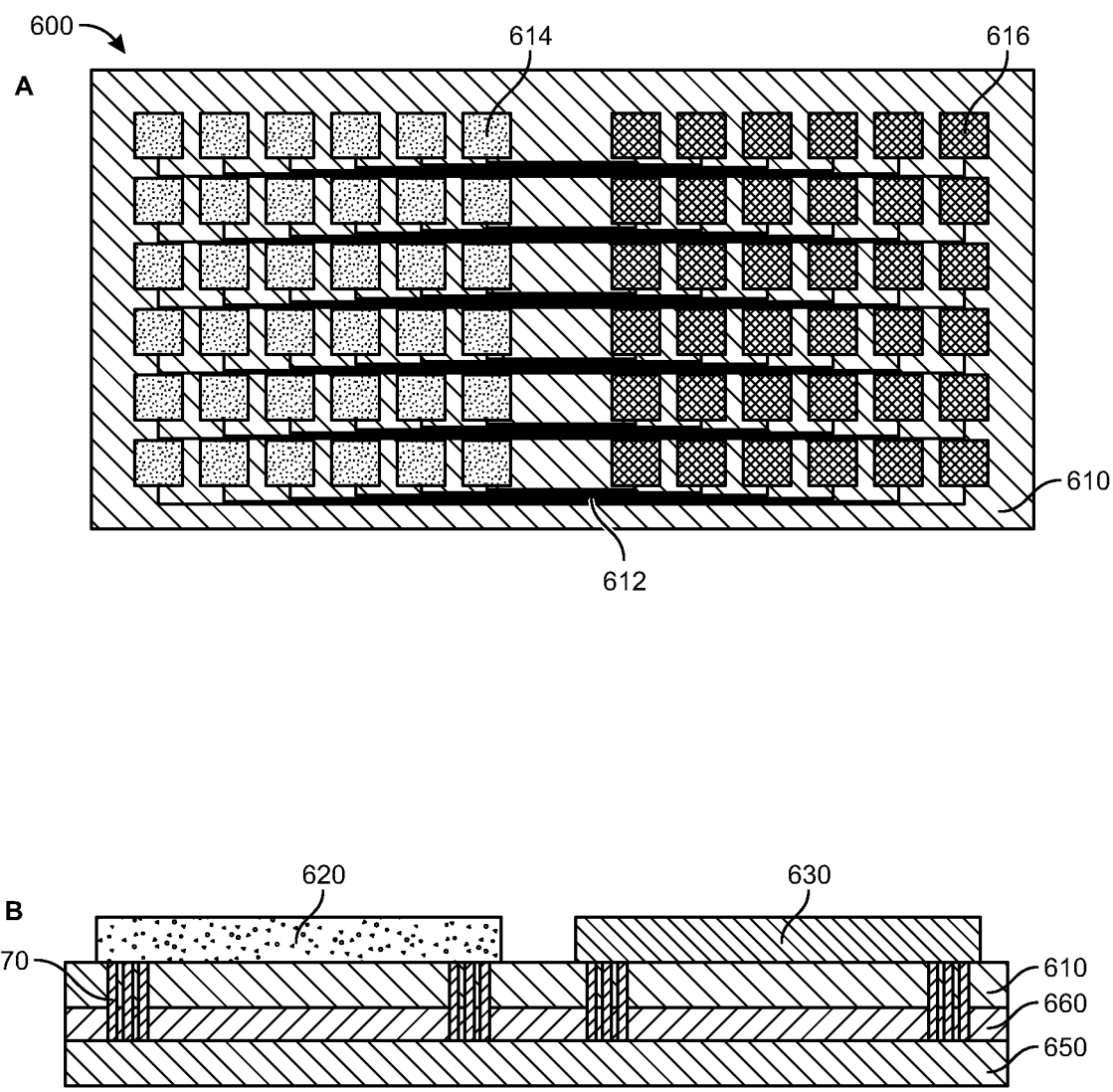
FIG. 6 illustrates a silicon-integrated photonic integrated circuit (PIC)-based photonic power converter according to further embodiments.
Figure 7:
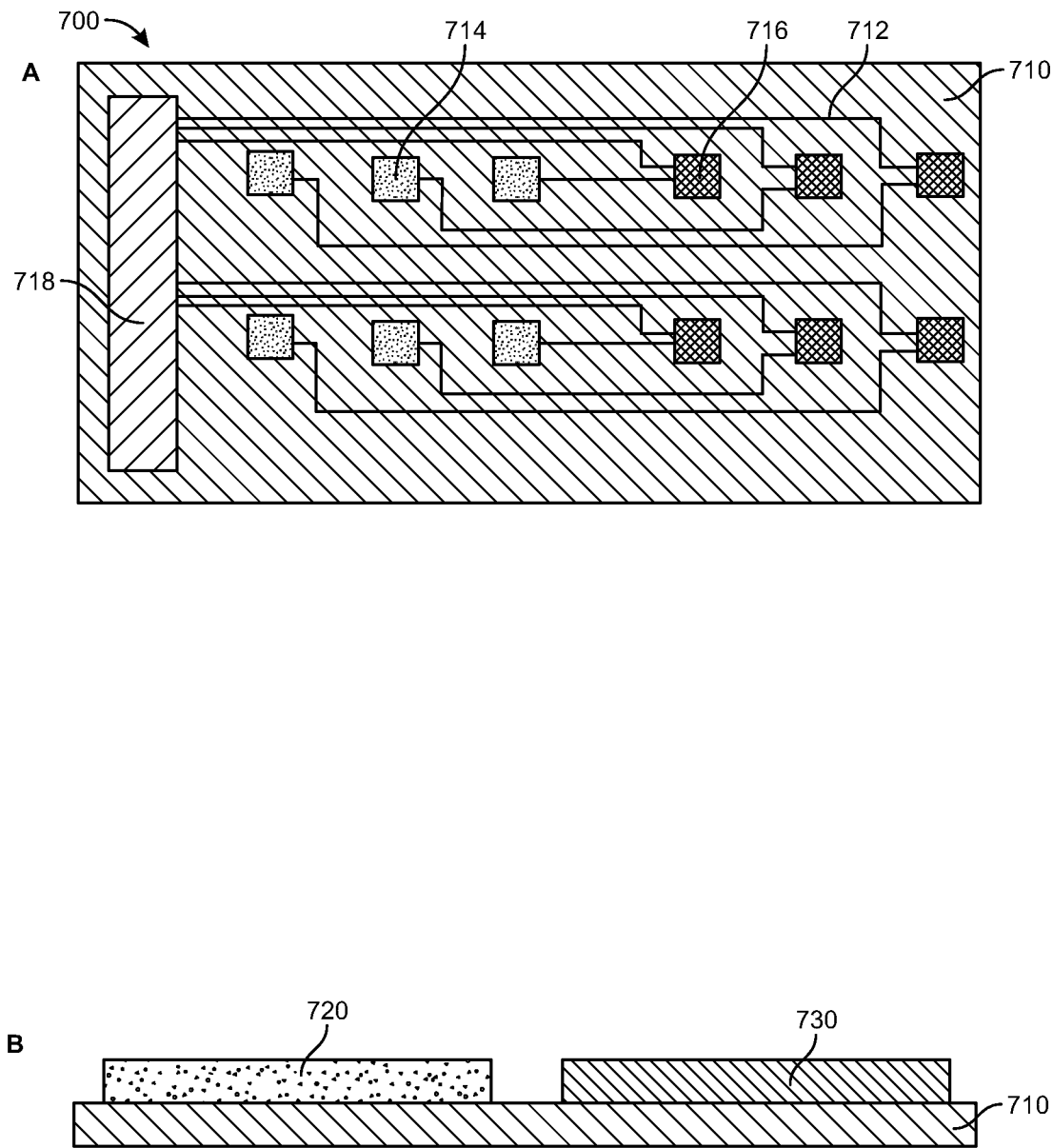
FIG. 7 illustrates a multi-source photonic integrated circuit (PIC)-based photonic power converter according to some embodiments.

Referring to FIG. 6, shown is a further example PIC-based photonic power converter including a layer of control silicon. A top-down plan view of PIC-based photonic power converter 600 is shown in FIG. 6A and a corresponding side view is shown in FIG. 6B. PIC-based photonic power converter 600 may include a photonic integrated circuit 610 with an array 620 of illumination sources (such as lasers or LEDs) and a corresponding array 630 of photovoltaic cells each disposed over the photonic integrated circuit 610. The illumination source array 620 may be laterally offset from the photovoltaic cell array 630.

With reference to FIG. 6B, the photonic integrated circuit 610 may be disposed over a semiconductor layer 650. An adhesive layer 660 may be disposed between the photonic integrated circuit 610 and the semiconductor layer 650. Metal-filled vias 670 may extend through both the photonic integrated circuit 610 and the adhesive layer 660 to provide electrical connections between the light sources within source array 620 and the semiconductor layer 650, as well as between the light detectors within photovoltaic cell array 630 and the semiconductor layer 650.

Photonic integrated circuit 610 may include optical channels 612 (e.g., waveguides) that are configured to route light that is emitted by illumination sources within source array 620 to the photovoltaic cells within photovoltaic cell array 630. Input gratings 614 and output gratings 616 may be respectively configured to direct light into and out of the optical channels 612.

According to further embodiments, a PIC-based photonic power converter may include more than a single light source per light detector. A top-down plan view of a PIC-based photonic power converter 700 is shown in FIG. 7A, and a corresponding side view is shown in FIG. 7B. PIC-based photonic power converter 700 includes a photonic integrated circuit 710 with an array of illumination sources 720 (e.g., lasers or LEDs) and a corresponding array of photovoltaic cells 730 each disposed over the photonic integrated circuit 710. In the illustrated embodiment, the illumination source array 720 is laterally offset from the photovoltaic cell array 730.

Photonic integrated circuit 710 may include optical channels 712 (e.g., waveguides) that are configured to route light that is emitted by the illumination sources within array 720 to the photovoltaic cells within array 730. Input gratings 714 and output gratings 716 may be respectively configured to direct light into and out of the optical channels 712. Additionally, photonic integrated circuit 710 may include an external light input grating 718. External light such as sunlight or light captured from other external sources may be routed via external light input grating 718 through optical channels 712 to output gratings 716 to supplement or replace light routed via input gratings 714.

Figure 8:
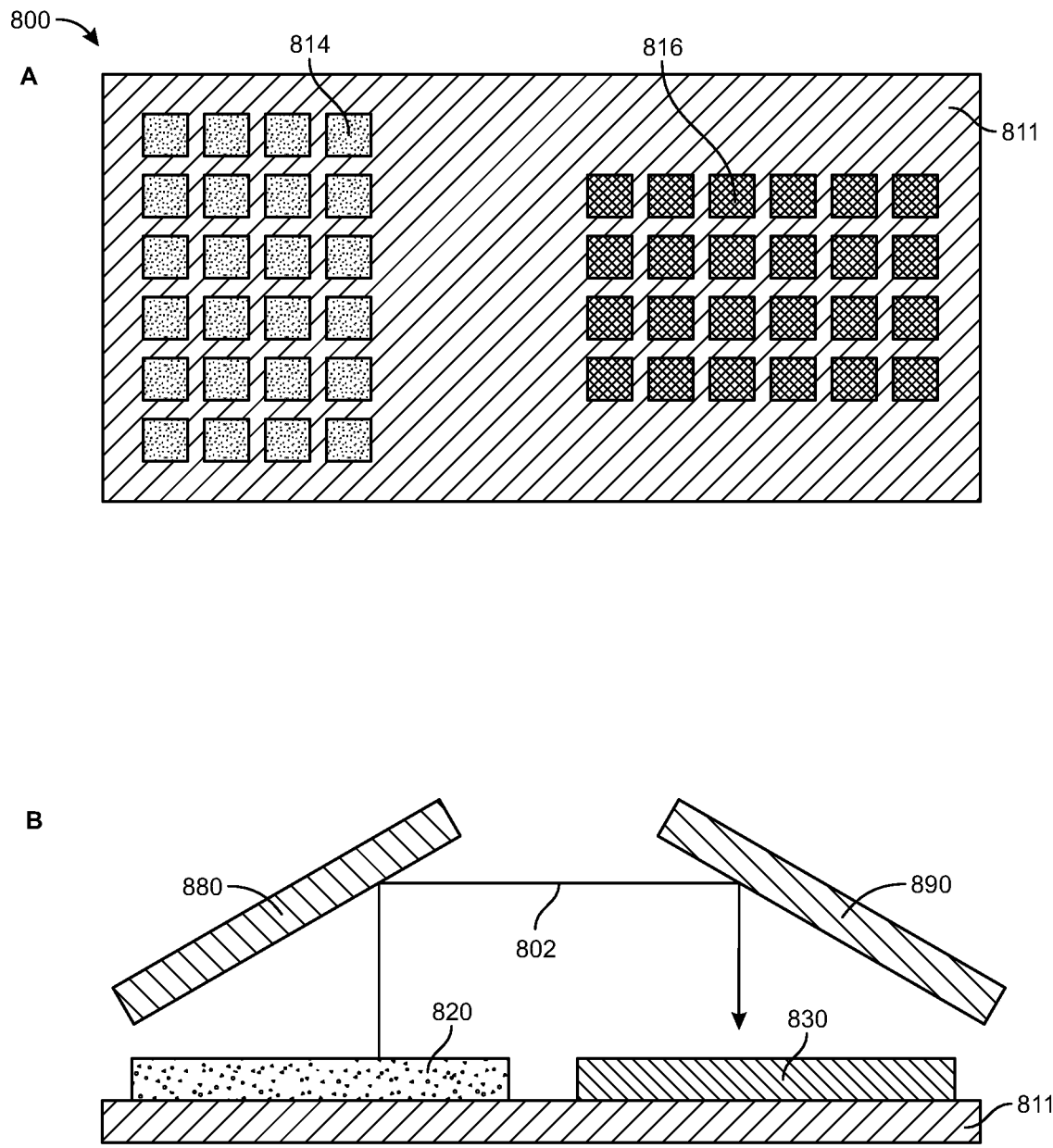
FIG. 8 illustrates a photonic power converter architecture including scanning mirrors for directing emitted light from one or more light sources to one or more light detectors according to some embodiments.

A further example photonic power converter is illustrated schematically in FIG. 8 and may include a microelectromechanical system (MEMS) mirror array or a digital micromirror device (DMD) to direct light from a light source to a light detector. With such a photonic power converter architecture, light may travel through vacuum, air, or other gas rather than through a PIC substrate.

A top-down plan view of a photonic power converter 800 according to further embodiments is shown in FIG. 8A, and a corresponding side view is shown in FIG. 8B. Photonic power converter 800 may include a dielectric substrate 811 having an array 820 of illumination sources (e.g., lasers or LEDs) and a corresponding array 830 of photovoltaic cells each disposed over the dielectric substrate 811. In some embodiments, the light source(s) and the light detector(s) may be located on a common substrate, whereas in some embodiments, the light source(s) and the light detector(s)

may be located on separate substrates. In the illustrated embodiment, the illumination source array 820 is laterally offset from the photovoltaic cell array 830 and the illumination source array 820 and the photovoltaic cell array 830 have a co-planar alignment.

Light 802 from light source array 820 may be directed to mirror arrays 880, 890 by input gratings 814 and routed to selected PV cells (not separately shown) within photovoltaic cell array 830 by output gratings 816. In such an approach, light 802 may exit the plane of the substrate 811.

An example device may be configured to include one mirror per light source. A further example device may be configured to include one mirror per light detector. According to some embodiments, one or more mirrors may be used to steer light from a plurality of light emitters. In a similar vein, one or more mirrors may be used to steer light to a plurality of light detectors. As will be appreciated, combinations of the foregoing MEMS architectures may be used. The mirrors 880, 890 may be controlled using analog or digital circuitry.

As disclosed herein, a high voltage optical transformer (HVOT) may include a light source configured to emit light and a light detector configured to receive the light emitted by the light source, where the light detector is laterally offset from the light source. By replacing the stacked source-detector architecture that is used in many comparative devices with a side-by-side geometry, the generation of excessive heat may be avoided and improved thermal management of the HVOT may be achieved. The HVOT may include a photonic integrated circuit that is configured to convey the emitted light from the light source to the light detector. A single light emitter or an array of emitters may be used. In a similar vein, the light detector may include a single detector or an array of light detectors such as an array of photovoltaic cells. In example architectures, the light source and the light detector may be located on a common plane.

Example Embodiments

Example 1: A device includes a light source configured to emit light and a light detector configured to receive the light emitted by the light source, where the light detector is laterally offset from the light source.

Example 2: The device of Example 1, where the light source includes a laser or a light-emitting diode.

Example 3: The device of any of Examples 1 and 2, where the light source includes an array of emitters.

Example 4: The device of any of Examples 1-3, further including an optical element selected from a polarizing filter and a ring resonator located in a path of the emitted light between the light source and the light detector.

Example 5: The device of any of Examples 1-4, where the light detector includes a photovoltaic cell.

Example 6: The device of any of Examples 1-5, where the light detector includes an array of photovoltaic cells.

Example 7: The device of any of Examples 1-6, where the light source includes a plurality of emitters, the light detector includes a plurality of photovoltaic cells, and each photovoltaic cell is configured to receive light emitted from a respective emitter.

Example 8: The device of any of Examples 1-7, where the light source includes a plurality of emitters, the light detector includes a plurality of photovoltaic cells, and the number of photovoltaic cells exceeds the number of emitters.

Example 9: The device of any of Examples 1-8, where the light source and the light detector are disposed on a common plane.

Example 10: The device of any of Examples 1-9, where the light source and the light detector are disposed on separate substrates.

Example 11: The device of any of Examples 1-10, where the emitted light is conveyed from the light source to the light detector via a photonic integrated circuit.

Example 12: The device of Example 11, where the photonic integrated circuit includes a planar waveguide.

Example 13: The device of Example 11, where the photonic integrated circuit includes a fiber optic cable.

Example 14: The device of any of Examples 10-13, where the photonic integrated circuit includes an input coupler disposed proximate to the light source configured to couple the emitted light into the photonic integrated circuit and an output coupler disposed proximate to the light detector configured to couple the emitted light out of the photonic integrated circuit.

Example 15: The device of any of Examples 10-14, where the photonic integrated circuit includes a compound selected from silicon nitride, aluminum oxide, and high molecular weight polyethylene.

Example 16: The device of any of Examples 1-10, further including a pair of MEMS mirror arrays configured to convey the emitted light from the light source to the light detector.

Example 17: A haptic glove including the device of any of Examples 1-16.

Example 18: A device includes a light source configured to emit light, a light detector configured to receive the light emitted by the light source, and a photonic integrated circuit configured to convey the emitted light from the light source to the light detector.

Example 19: The device of Example 18, where the light source and the light detector are located on a common plane.

Example 20: A method includes (a) generating a first beam of light using a first emitter, the first beam of light having a first wavelength, (b) generating a second beam of light using a second emitter, the second beam of light having a second wavelength, (c) merging the first beam of light with the second beam of light to form a combined beam of light, and (d) directing the combined beam of light to a light detector laterally offset from the first emitter and the second emitter.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (e.g., augmented-reality system 900 in FIG. 9) or that visually immerses a user in an artificial reality (e.g., virtual-reality system 1000 in FIG. 10). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 9:
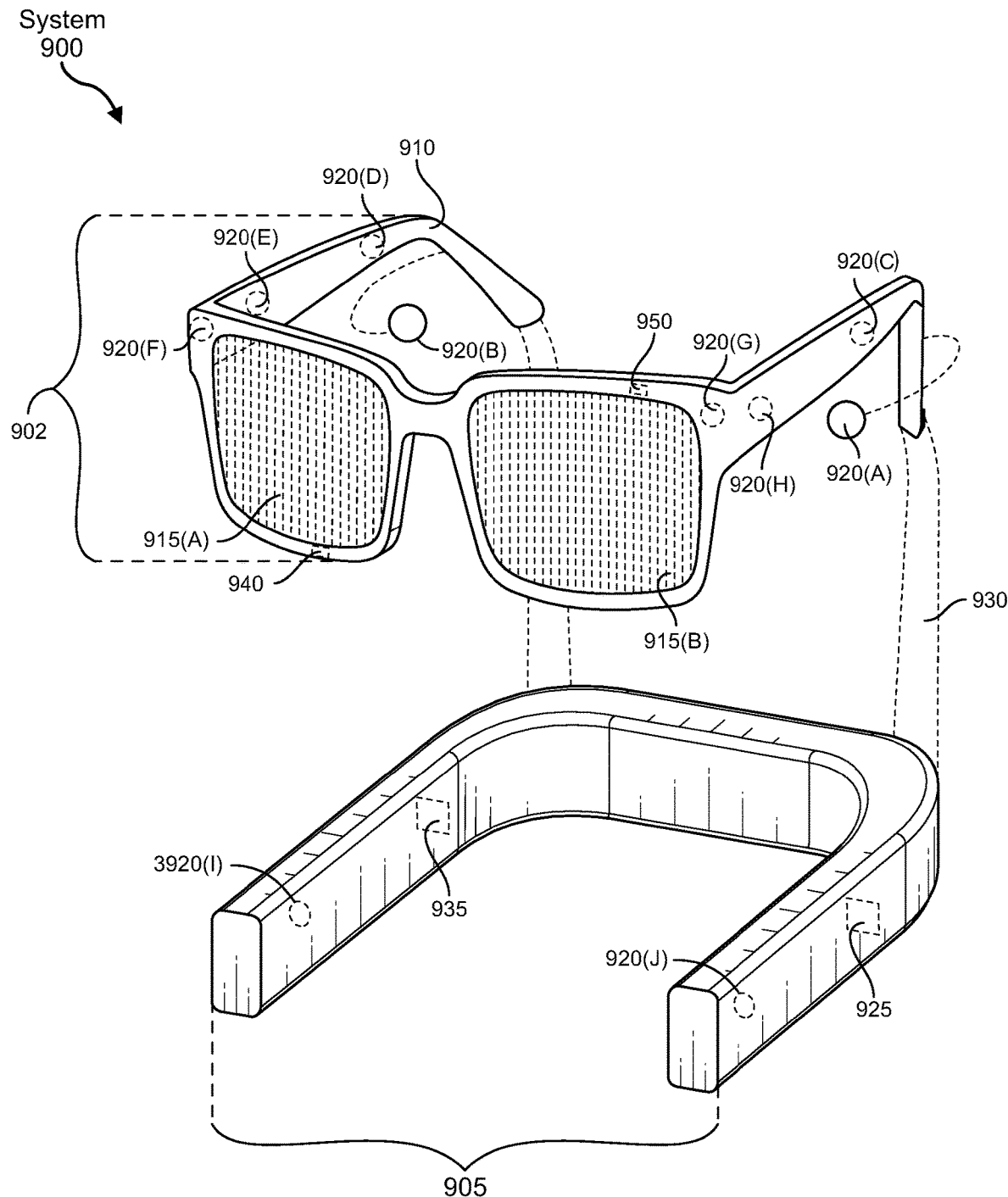
FIG. 9 is an illustration of exemplary augmented-reality glasses that may be used in connection with embodiments of this disclosure.

Turning to FIG. 9, augmented-reality system 900 may include an eyewear device 902 with a frame 910 configured to hold a left display device 915(A) and a right display device 915(B) in front of a user's eyes. Display devices 915(A) and 915(B) may act together or independently to present an image or series of images to a user. While augmented-reality system 900 includes two displays, embodiments of this disclosure may be implemented in augmented-reality systems with a single NED or more than two NEDs.

In some embodiments, augmented-reality system 900 may include one or more sensors, such as sensor 940. Sensor 940 may generate measurement signals in response to motion of augmented-reality system 900 and may be located on substantially any portion of frame 910. Sensor 940 may represent a position sensor, an inertial measurement unit (IMU), a depth camera assembly, a structured light emitter and/or detector, or any combination thereof. In some embodiments, augmented-reality system 900 may or may not include sensor 940 or may include more than one sensor. In embodiments in which sensor 940 includes an IMU, the IMU may generate calibration data based on measurement signals from sensor 940. Examples of sensor 940 may include, without limitation, accelerometers, gyroscopes, magnetometers, other suitable types of sensors that detect motion, sensors used for error correction of the IMU, or some combination thereof.

Augmented-reality system 900 may also include a microphone array with a plurality of acoustic transducers 920(A)-920(J), referred to collectively as acoustic transducers 920. Acoustic transducers 920 may be transducers that detect air pressure variations induced by sound waves. Each acoustic transducer 920 may be configured to detect sound and convert the detected sound into an electronic format (e.g., an analog or digital format). The microphone array in FIG. 9 may include, for example, ten acoustic transducers: 920(A) and 920(B), which may be designed to be placed inside a corresponding ear of the user, acoustic transducers 920(C), 920(D), 920(E), 920(F), 920(G), and 920(H), which may be positioned at various locations on frame 910, and/or acoustic transducers 920(I) and 920(J), which may be positioned on a corresponding neckband 905.

In some embodiments, one or more of acoustic transducers 920(A)-(F) may be used as output transducers (e.g., speakers). For example, acoustic transducers 920(A) and/or 920(B) may be earbuds or any other suitable type of headphone or speaker.

The configuration of acoustic transducers 920 of the microphone array may vary. While augmented-reality system 900 is shown in FIG. 9 as having ten acoustic transducers 920, the number of acoustic transducers 920 may be greater or less than ten. In some embodiments, using higher numbers of acoustic transducers 920 may increase the amount of audio information collected and/or the sensitivity and accuracy of the audio information. In contrast, using a lower number of acoustic transducers 920 may decrease the computing power required by an associated controller 950 to process the collected audio information. In addition, the position of each acoustic transducer 920 of the microphone array may vary. For example, the position of an acoustic transducer 920 may include a defined position on the user, a defined coordinate on frame 910, an orientation associated with each acoustic transducer 920, or some combination thereof.

Acoustic transducers 920(A) and 920(B) may be positioned on different parts of the user's ear, such as behind the pinna, behind the tragus, and/or within the auricle or fossa. Or, there may be additional acoustic transducers 920 on or surrounding the ear in addition to acoustic transducers 920 inside the ear canal. Having an acoustic transducer 920 positioned next to an ear canal of a user may enable the microphone array to collect information on how sounds arrive at the ear canal. By positioning at least two of acoustic transducers 920 on either side of a user's head (e.g., as binaural microphones), augmented-reality device 900 may simulate binaural hearing and capture a 3D stereo sound field around about a user's head. In some embodiments, acoustic transducers 920(A) and 920(B) may be connected to augmented-reality system 900 via a wired connection 930, and in other embodiments acoustic transducers 920(A) and 920(B) may be connected to augmented-reality system 900 via a wireless connection (e.g., a Bluetooth connection). In still other embodiments, acoustic transducers 920(A) and 920(B) may not be used at all in conjunction with augmented-reality system 900.

Acoustic transducers 920 on frame 910 may be positioned along the length of the temples, across the bridge, above or below display devices 915(A) and 915(B), or some combination thereof. Acoustic transducers 920 may be oriented such that the microphone array is able to detect sounds in a wide range of directions surrounding the user wearing the augmented-reality system 900. In some embodiments, an optimization process may be performed during manufacturing of augmented-reality system 900 to determine relative positioning of each acoustic transducer 920 in the microphone array.

In some examples, augmented-reality system 900 may include or be connected to an external device (e.g., a paired device), such as neckband 905. Neckband 905 generally represents any type or form of paired device. Thus, the following discussion of neckband 905 may also apply to various other paired devices, such as charging cases, smart watches, smart phones, wrist bands, other wearable devices, hand-held controllers, tablet computers, laptop computers, other external compute devices, etc.

As shown, neckband 905 may be coupled to eyewear device 902 via one or more connectors. The connectors may be wired or wireless and may include electrical and/or non-electrical (e.g., structural) components. In some cases, eyewear device 902 and neckband 905 may operate independently without any wired or wireless connection between them. While FIG. 9 illustrates the components of eyewear device 902 and neckband 905 in example locations on eyewear device 902 and neckband 905, the components may be located elsewhere and/or distributed differently on eyewear device 902 and/or neckband 905. In some embodiments, the components of eyewear device 902 and neckband 905 may be located on one or more additional peripheral devices paired with eyewear device 902, neckband 905, or some combination thereof.

Pairing external devices, such as neckband 905, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 900 may be provided by a paired device or shared between a paired device and an eyewear device, thus reducing the weight, heat profile, and form factor of the eyewear device overall while still retaining desired functionality. For example, neckband 905 may allow components that would otherwise be included on an eyewear device to be included in neckband 905 since users may tolerate a heavier weight load on their shoulders than they would tolerate on their heads. Neckband 905 may also have a larger surface area over which to diffuse and disperse heat to the ambient environment. Thus, neckband 905 may allow for greater battery and computation capacity than might otherwise have been possible on a stand-alone eyewear device. Since weight carried in neckband 905 may be less invasive to a user than weight carried in eyewear device 902, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 905 may be communicatively coupled with eyewear device 902 and/or to other devices. These other devices may provide certain functions (e.g., tracking, localizing, depth mapping, processing, storage, etc.) to augmented-reality system 900. In the embodiment of FIG. 9, neckband 905 may include two acoustic transducers (e.g., 920(I) and 920(J)) that are part of the microphone array (or potentially form their own microphone subarray). Neckband 905 may also include a controller 925 and a power source 935.

Acoustic transducers 920(I) and 920(J) of neckband 905 may be configured to detect sound and convert the detected sound into an electronic format (analog or digital). In the embodiment of FIG. 9, acoustic transducers 920(I) and 920(J) may be positioned on neckband 905, thereby increasing the distance between the neckband acoustic transducers 920(I) and 920(J) and other acoustic transducers 920 positioned on eyewear device 902. In some cases, increasing the distance between acoustic transducers 920 of the microphone array may improve the accuracy of beamforming performed via the microphone array. For example, if a sound is detected by acoustic transducers 920(C) and 920(D) and the distance between acoustic transducers 920(C) and 920 (D) is greater than, e.g., the distance between acoustic transducers 920(D) and 920(E), the determined source location of the detected sound may be more accurate than if the sound had been detected by acoustic transducers 920(D) and 920(E).

Controller 925 of neckband 905 may process information generated by the sensors on neckband 905 and/or augmented-reality system 900. For example, controller 925 may process information from the microphone array that describes sounds detected by the microphone array. For each detected sound, controller 925 may perform a direction-of-arrival (DOA) estimation to estimate a direction from which the detected sound arrived at the microphone array. As the microphone array detects sounds, controller 925 may populate an audio data set with the information. In embodiments in which augmented-reality system 900 includes an inertial measurement unit, controller 925 may compute all inertial and spatial calculations from the IMU located on eyewear device 902. A connector may convey information between augmented-reality system 900 and neckband 905 and between augmented-reality system 900 and controller 925. The information may be in the form of optical data, electrical data, wireless data, or any other transmittable data form. Moving the processing of information generated by augmented-reality system 900 to neckband 905 may reduce weight and heat in eyewear device 902, making it more comfortable to the user.

Power source 935 in neckband 905 may provide power to eyewear device 902 and/or to neckband 905. Power source 935 may include, without limitation, lithium ion batteries, lithium-polymer batteries, primary lithium batteries, alkaline batteries, or any other form of power storage. In some cases, power source 935 may be a wired power source. Including power source 935 on neckband 905 instead of on eyewear device 902 may help better distribute the weight and heat generated by power source 935.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1000 in FIG. 10, that mostly or completely covers a user's field of view. Virtual-reality system 1000 may include a front rigid body 1002 and a band 1004 shaped to fit around a user's head. Virtual-reality system 1000 may also include output audio transducers 1006(A) and 1006(B). Furthermore, while not shown in FIG. 10, front rigid body 1002 may include one or more electronic elements, including one or more electronic displays, one or more inertial measurement units (IMUs), one or more tracking emitters or detectors, and/or any other suitable device or system for creating an artificial reality experience.

Artificial-reality systems may include a variety of types of visual feedback mechanisms. For example, display devices in augmented-reality system 900 and/or virtual-reality system 1000 may include one or more liquid crystal displays (LCDs), light emitting diode (LED) displays, organic LED (OLED) displays, digital light project (DLP) micro-displays, liquid crystal on silicon (LCoS) micro-displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial-reality systems may include one or more projection systems. For example, display devices in augmented-reality system 900 and/or virtual-reality system 1000 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

Artificial-reality systems may also include various types of computer vision components and subsystems. For example, augmented-reality system 900 and/or virtual-reality system 1000 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about a real-world surroundings, and/or to perform a variety of other functions.

Artificial-reality systems may also include one or more input and/or output audio transducers. In the examples shown in FIG. 10, output audio transducers 1006(A) and 1006(B) may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

While not shown in FIG. 9, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

As noted, artificial-reality systems 900 and 1000 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 11:
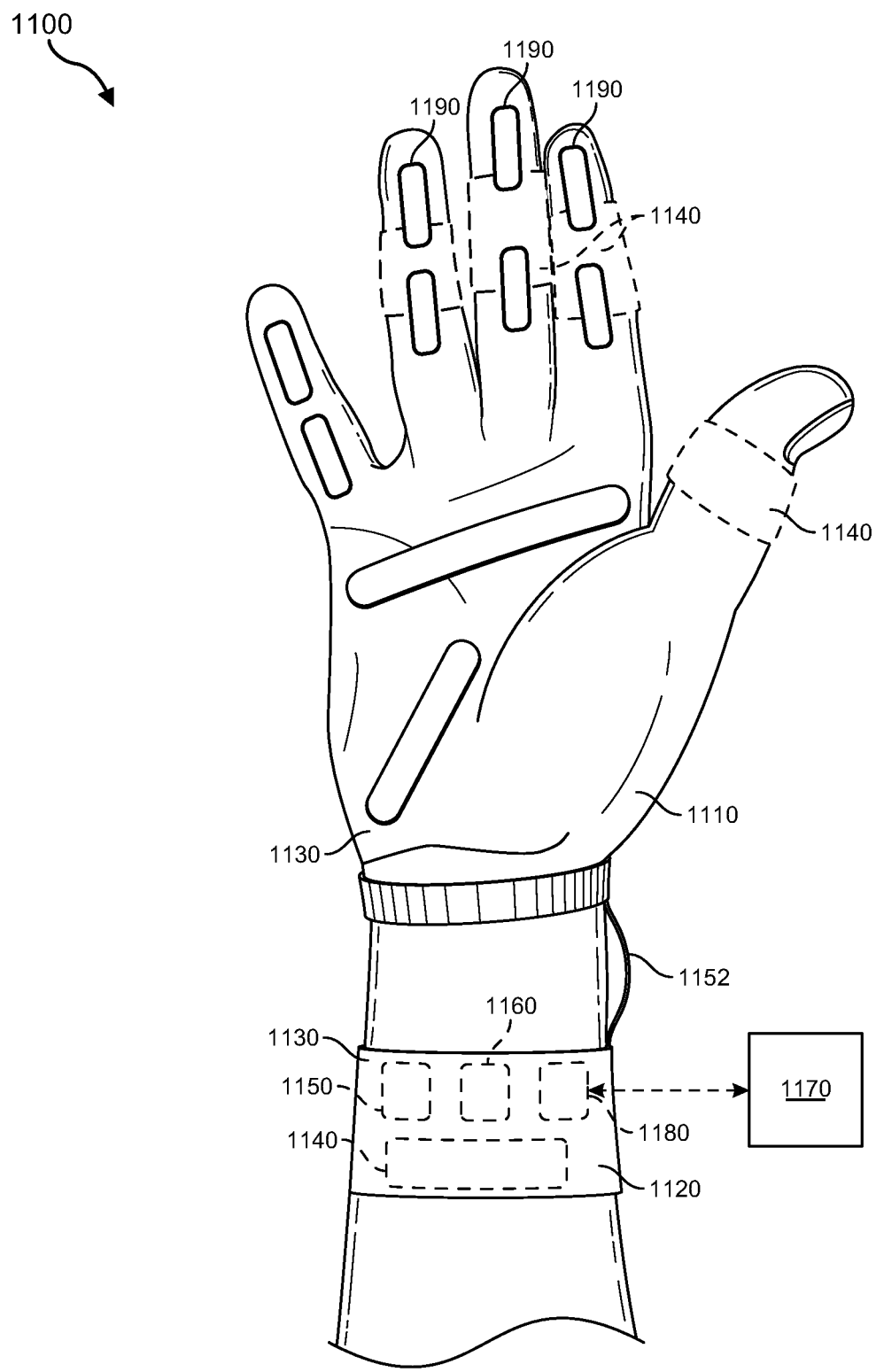
FIG. 11 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 11 illustrates a vibrotactile system 1100 in the form of a wearable glove (haptic device 1110) and wristband (haptic device 1120). Haptic device 1110 and haptic device 1120 are shown as examples of wearable devices that include a flexible, wearable textile material 1130 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1140 may be positioned at least partially within one or more corresponding pockets formed in textile material 1130 of vibrotactile system 1100. Vibrotactile devices 1140 may be positioned in locations to provide a vibrating sensation (e.g., haptic feedback) to a user of vibrotactile system 1100. For example, vibrotactile devices 1140 may be positioned against the user's finger(s), thumb, or wrist, as shown in FIG. 11. Vibrotactile devices 1140 may, in some examples, be sufficiently flexible to conform to or bend with the user's corresponding body part(s).

A power source 1150 (e.g., a battery) for applying a voltage to the vibrotactile devices 1140 for activation thereof may be electrically coupled to vibrotactile devices 1140, such as via conductive wiring 1152. In some examples, each of vibrotactile devices 1140 may be independently electrically coupled to power source 1150 for individual activation. In some embodiments, a processor 1160 may be operatively coupled to power source 1150 and configured (e.g., programmed) to control activation of vibrotactile devices 1140.

Vibrotactile system 1100 may be implemented in a variety of ways. In some examples, vibrotactile system 1100 may be a standalone system with integral subsystems and components for operation independent of other devices and systems. As another example, vibrotactile system 1100 may be configured for interaction with another device or system 1170. For example, vibrotactile system 1100 may, in some examples, include a communications interface 1180 for receiving and/or sending signals to the other device or system 1170. The other device or system 1170 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 1180 may enable communications between vibrotactile system 1100 and the other device or system 1170 via a wireless (e.g., Wi-Fi, Bluetooth, cellular, radio, etc.) link or a wired link. If present, communications interface 1180 may be in communication with processor 1160, such as to provide a signal to processor 1160 to activate or deactivate one or more of the vibrotactile devices 1140.

Vibrotactile system 1100 may optionally include other subsystems and components, such as touch-sensitive pads 1190, pressure sensors, motion sensors, position sensors, lighting elements, and/or user interface elements (e.g., an on/off button, a vibration control element, etc.). During use, vibrotactile devices 1140 may be configured to be activated for a variety of different reasons, such as in response to the user's interaction with user interface elements, a signal from the motion or position sensors, a signal from the touch-sensitive pads 1190, a signal from the pressure sensors, a signal from the other device or system 1170, etc.

Although power source 1150, processor 1160, and communications interface 1180 are illustrated in FIG. 11 as being positioned in haptic device 1120, the present disclosure is not so limited. For example, one or more of power source 1150, processor 1160, or communications interface 1180 may be positioned within haptic device 1110 or within another wearable textile.

Figure 12:
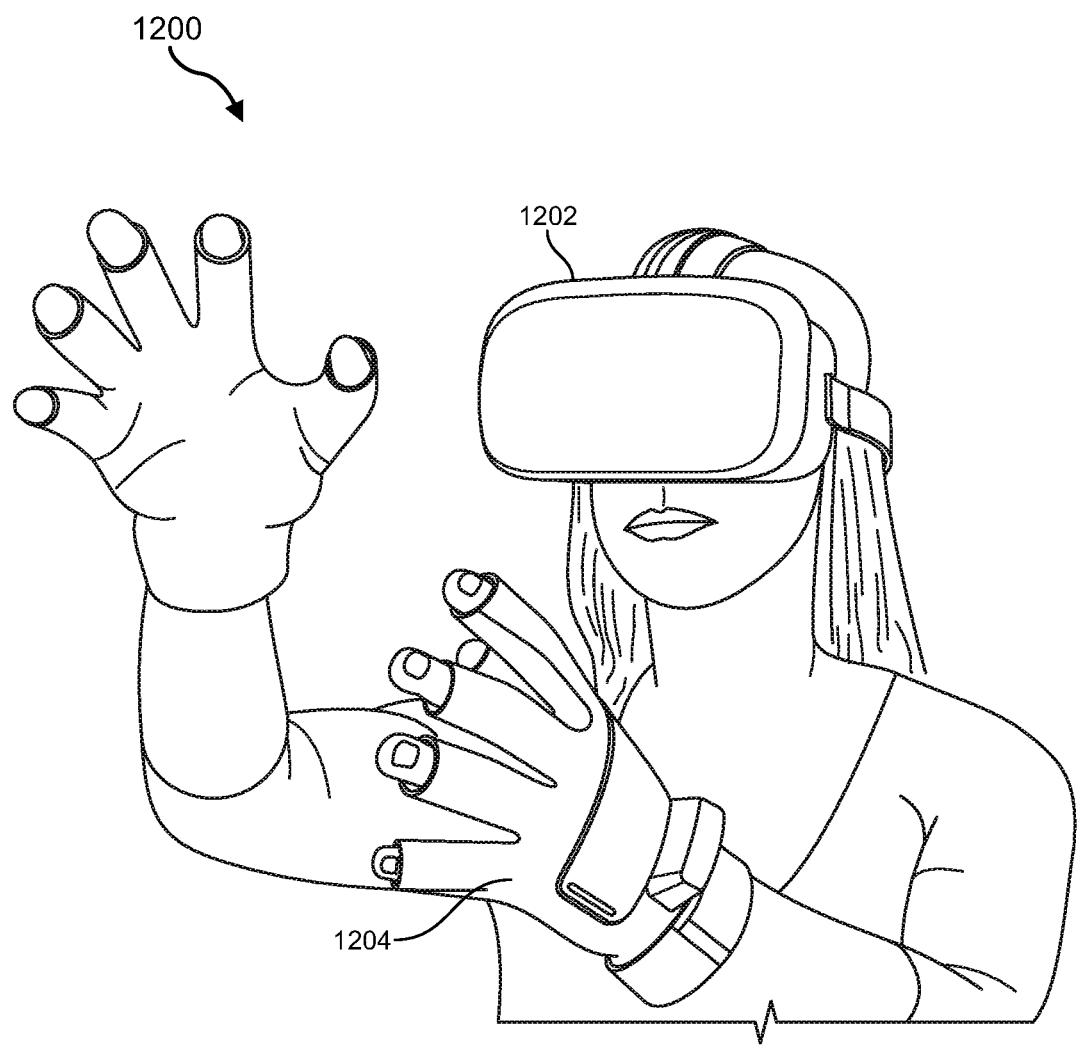
FIG. 12 is an illustration of an exemplary virtual-reality environment according to embodiments of this disclosure.

Haptic wearables, such as those shown in and described in connection with FIG. 11, may be implemented in a variety of types of artificial-reality systems and environments. FIG. 12 shows an example artificial-reality environment 1200 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Figure 10:
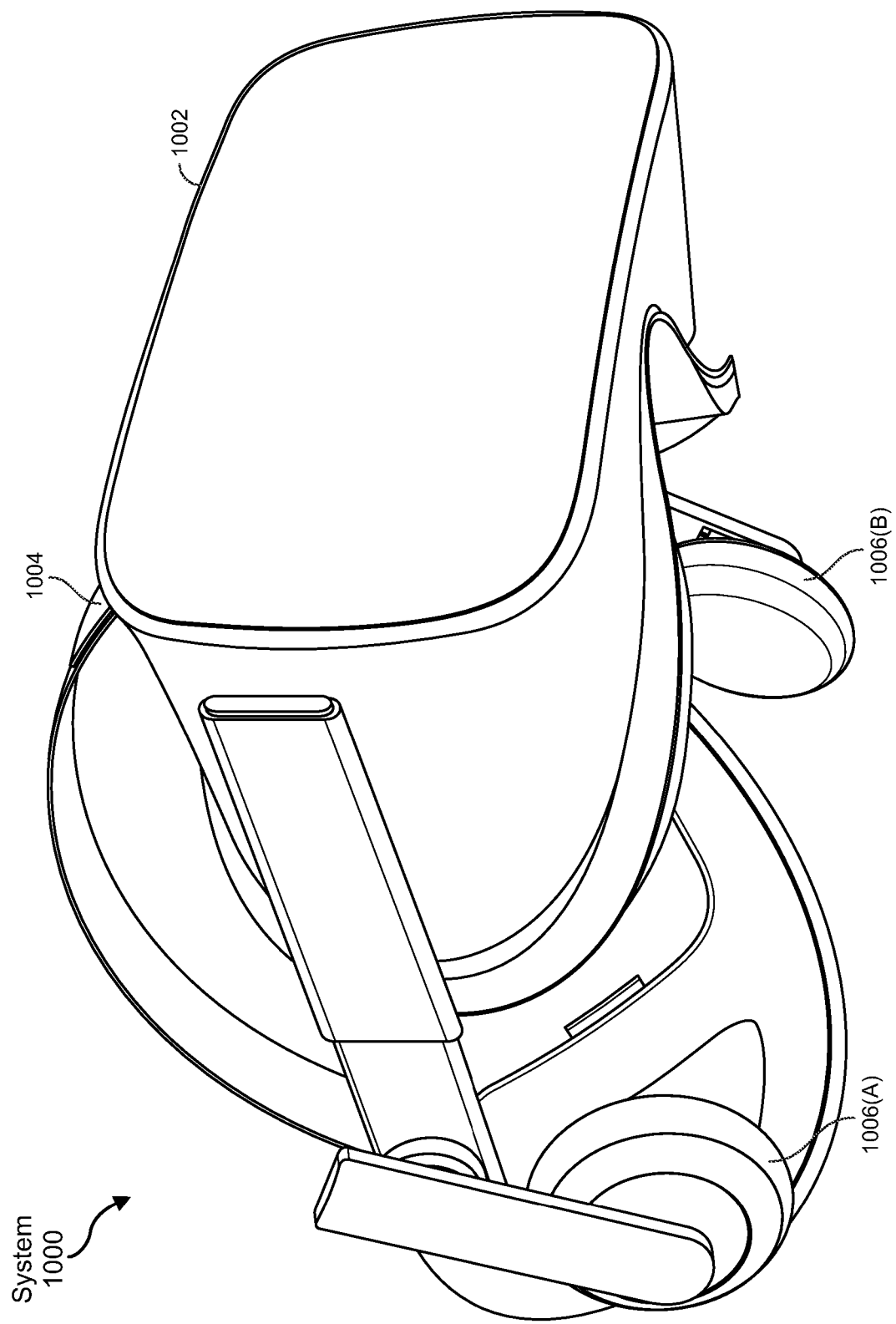
FIG. 10 is an illustration of an exemplary virtual-reality headset that may be used in connection with embodiments of this disclosure.

Head-mounted display 1202 generally represents any type or form of virtual-reality system, such as virtual-reality system 1000 in FIG. 10. Haptic device 1204 generally represents any type or form of wearable device, worn by a user of an artificial-reality system, that provides haptic feedback to the user to give the user the perception that he or she is physically engaging with a virtual object. In some embodiments, haptic device 1204 may provide haptic feedback by applying vibration, motion, and/or force to the user. For example, haptic device 1204 may limit or augment a user's movement. To give a specific example, haptic device 1204 may limit a user's hand from moving forward so that the user has the perception that his or her hand has come in physical contact with a virtual wall. In this specific example, one or more actuators within the haptic device may achieve the physical-movement restriction by pumping fluid into an inflatable bladder of the haptic device. In some examples, a user may also use haptic device 1204 to send action requests to a console. Examples of action requests include, without limitation, requests to start an application and/or end the application and/or requests to perform a particular action within the application.

Figure 13:
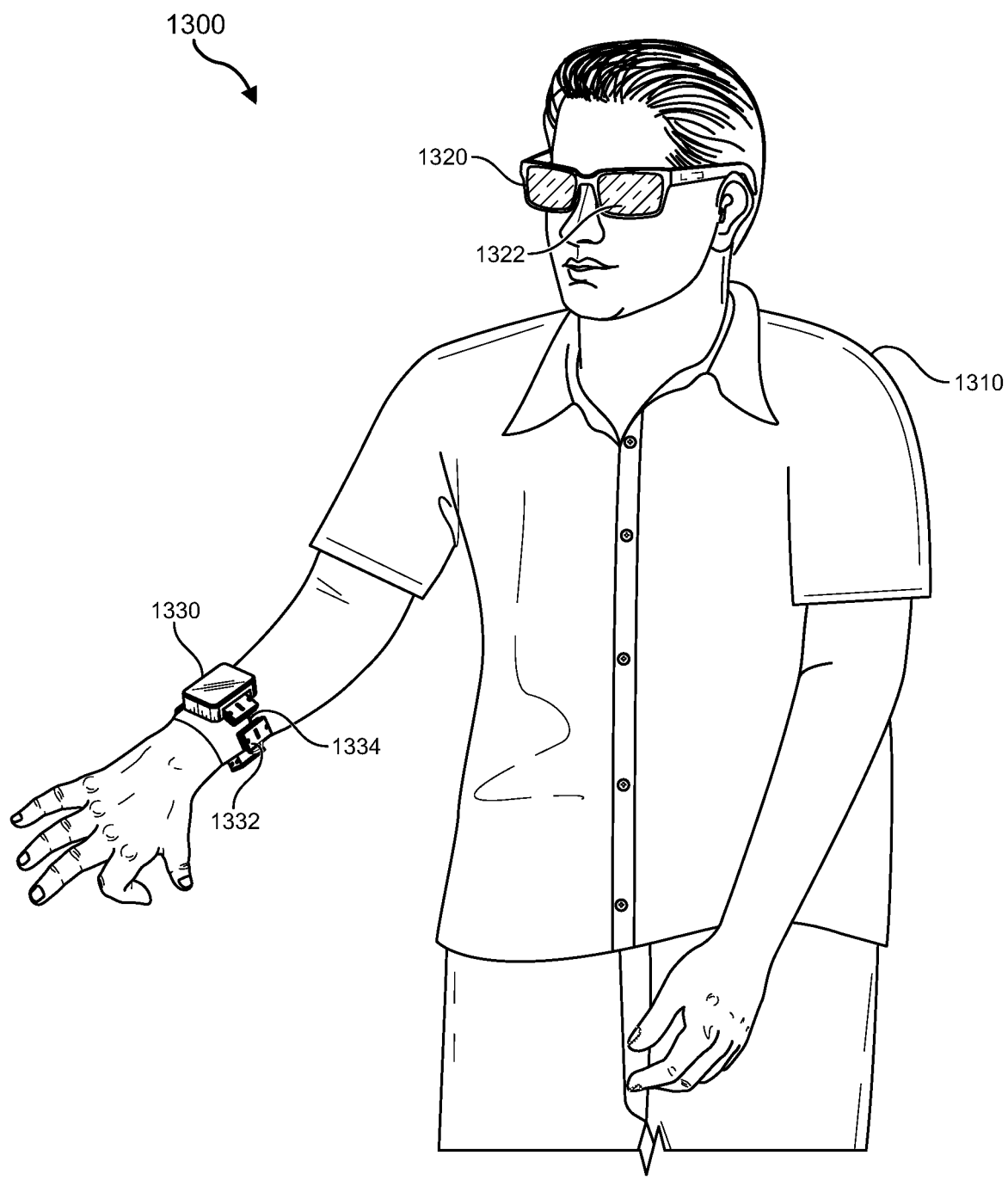
FIG. 13 is an illustration of an exemplary augmented-reality environment according to embodiments of this disclosure.

While haptic interfaces may be used with virtual-reality systems, as shown in FIG. 12, haptic interfaces may also be used with augmented-reality systems, as shown in FIG. 13. FIG. 13 is a perspective view of a user 1310 interacting with an augmented-reality system 1300. In this example, user 1310 may wear a pair of augmented-reality glasses 1320 that may have one or more displays 1322 and that are paired with a haptic device 1330. In this example, haptic device 1330 may be a wristband that includes a plurality of band elements 1332 and a tensioning mechanism 1334 that connects band elements 1332 to one another.

One or more of band elements 1332 may include any type or form of actuator suitable for providing haptic feedback. For example, one or more of band elements 1332 may be configured to provide one or more of various types of cutaneous feedback, including vibration, force, traction, texture, and/or temperature. To provide such feedback, band elements 1332 may include one or more of various types of actuators. In one example, each of band elements 1332 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1110, 1120, 1204, and 1330 may include any suitable number and/or type of haptic transducer, sensor, and/or feedback mechanism. For example, haptic devices 1110, 1120, 1204, and 1330 may include one or more mechanical transducers, piezoelectric transducers, and/or fluidic transducers. Haptic devices 1110, 1120, 1204, and 1330 may also include various combinations of different types and forms of transducers that work together or independently to enhance a user's artificial-reality experience. In one example, each of band elements 1332 of haptic device 1330 may include a vibrotactor (e.g., a vibrotactile actuator) configured to vibrate in unison or independently to provide one or more of various types of haptic sensations to a user.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

As used herein, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a light beam that comprises or includes visible light include embodiments where a light beam consists essentially of visible light and embodiments where a light beam consists of visible light.

What is claimed is:

1. A device comprising:
   a light source configured to emit light;
   a low voltage circuit electrically coupled to and configured to provide power to the light source;
   a high voltage output circuit that is electrically isolated from the low voltage circuit;
   a light detector, electrically coupled to the high voltage output circuit, configured to:
     receive light emitted by the light source;
     convert the received light to a scalable output voltage; and
     provide, via the high voltage output circuit, the scalable output voltage to an additional device that is electrically coupled to the high voltage output circuit; and
   a photonic integrated circuit disposed between and optically coupled to both the light source detector, wherein the photonic integrated circuit is configured to guide emitted light from the light source to the light detector.

2. The device of claim 1, wherein the light source comprises a laser or a light-emitting diode.

3. The device of claim 1, wherein the light source comprises an array of emitters.

4. The device of claim 3, further comprising an optical element selected from the group consisting of a polarizing filter and a ring resonator located in a path of the emitted light between the light source and the light detector.

5. The device of claim 1, wherein the light detector comprises a photovoltaic cell.

6. The device of claim 1, wherein the light detector comprises an array of photovoltaic cells.

7. The device of claim 1, wherein the light source comprises a plurality of emitters, the light detector comprises a plurality of photovoltaic cells, and each photovoltaic cell is configured to receive light emitted from a respective emitter.

8. The device of claim 1, wherein the light source comprises a plurality of emitters, the light detector comprises a plurality of photovoltaic cells, and the number of photovoltaic cells exceeds the number of emitters.

9. The device of claim 1, wherein the light source and the light detector are disposed on a common plane.

10. The device of claim 1, wherein the emitted light is conveyed from the light source to the light detector via the photonic integrated circuit.

11. The device of claim 1, wherein the photonic integrated circuit comprises a planar waveguide.

12. The device of claim 1, wherein the photonic integrated circuit comprises a fiber optic cable.

13. The device of claim 1, wherein the photonic integrated circuit comprises an input coupler disposed proximate to the light source configured to couple the emitted light into the photonic integrated circuit and an output coupler disposed proximate to the light detector configured to couple the emitted light out of the photonic integrated circuit.

14. The device of claim 1, wherein the photonic integrated circuit comprises a compound selected from the group consisting of silicon nitride, aluminum oxide, and high molecular weight polyethylene.

15. The device of claim 1, further comprising a pair of MEMS mirror arrays configured to convey the emitted light from the light source to the light detector.

16. A haptic glove comprising the device of claim 1.

17. A device comprising:
   a light source configured to emit light;
   a low voltage circuit electrically coupled to and configured to provide power to the light source;
   a high voltage output circuit that is electrically isolated from the low voltage circuit;
   a light detector, electrically coupled to the high voltage output circuit, configured to:
     receive light emitted by the light source;
     convert the received light to a scalable output voltage; and
     provide, via the high voltage output circuit, the scalable output voltage to an additional device that is electrically coupled to the high voltage output circuit; and
   a photonic integrated circuit disposed between and optically coupled to both the light source and the light detector, wherein the photonic integrated circuit is configured to guide emitted light from the light source to the light detector.

18. The device of claim 17, wherein the light source and the light detector are located on a common plane.

19. A method comprising:
   generating a first beam of light using a first emitter, the first emitter being configured to receive low voltage power, the first beam of light comprising a first wavelength;
   generating a second beam of light using a second emitter, the second emitter being configured to receive low voltage power, the second beam of light comprising a second wavelength;
   merging, by a photonic integrated circuit disposed between a optically coupled to the first emitter, the second emitter, and a light detector, the first beam of light with the second beam of light to form a combined beam of light;

directing, by the photonic integrated circuit, the combined beam of light to the light detector, the light detector being configured to convert the combined beam of light into a high voltage power output and output the high voltage power output to a high voltage output circuit, laterally offset from the first emitter and the second emitter, wherein the first emitter, the second emitter, and the light detector are located on a common substrate; and providing, via the high voltage output circuit, the high voltage power output to an additional device that is electrically coupled to the high voltage output circuit.

\* \* \* \* \*